United States Patent
Kim et al.

(10) Patent No.: US 9,673,811 B2
(45) Date of Patent: Jun. 6, 2017

(54) LOW POWER CONSUMPTION AC LOAD SWITCHES

(71) Applicant: Honeywell International Inc., Morristown, NJ (US)

(72) Inventors: Hyunki Kim, Rogers, MN (US); Robert D. Juntunen, Minnetonka, MN (US)

(73) Assignee: Honeywell International Inc., Morris Plains, NJ (US)

( * ) Notice: Subject to any disclaimer, the term of this patent is extended or adjusted under 35 U.S.C. 154(b) by 742 days.

(21) Appl. No.: 14/088,306

(22) Filed: Nov. 22, 2013

(65) Prior Publication Data

US 2015/0145347 A1   May 28, 2015

(51) Int. Cl.
*H03K 17/687* (2006.01)
*H03K 17/691* (2006.01)

(52) U.S. Cl.
CPC ......... *H03K 17/687* (2013.01); *H03K 17/691* (2013.01); *H03K 2217/0009* (2013.01); *H03K 2217/0036* (2013.01); *H03K 2217/0063* (2013.01); *H03K 2217/0072* (2013.01); *Y10T 307/747* (2015.04)

(58) Field of Classification Search
None
See application file for complete search history.

(56) References Cited

U.S. PATENT DOCUMENTS

| | | | |
|---|---|---|---|
| 3,464,673 A | 9/1969 | Cargo et al. | |
| 3,665,159 A | 5/1972 | Becker et al. | |
| 3,899,713 A | 8/1975 | Barkan et al. | |
| 3,942,028 A | 3/1976 | Baker | |
| 4,078,720 A | 3/1978 | Nurnberg | |
| 4,079,366 A | 3/1978 | Wong | |

(Continued)

FOREIGN PATENT DOCUMENTS

| | | |
|---|---|---|
| CA | 1035448 A | 7/1978 |
| DE | 3334117 A1 | 4/1985 |

(Continued)

OTHER PUBLICATIONS

U.S. Appl. No. 14/300,228, filed Jun. 9, 2014.

(Continued)

*Primary Examiner* — Jared Fureman
*Assistant Examiner* — James Evans
(74) *Attorney, Agent, or Firm* — Seager, Tufte & Wickhem, LLP

(57) ABSTRACT

A circuit for ensuring ultra-low power relay switching to control an AC load and extend a battery's lifetime. A control circuit may be designed to work where power is provided at very low duty cycles in that the on-time of applied voltage is quite short compared to its off-time. During the on-time, power such as that from a battery may be consumed to drive the circuit but overall such consumption of power is almost miniscule, for instance, a few microamperes or less from a three volt battery. An input FET may drive a pair of switching FETs that provide pulses to a transformer which provides a ramp of voltage that remains above zero volts to a pair of AC switch FETs. An output of the AC switch may go to operate relays of a wire saver for operating one or more thermostats.

16 Claims, 5 Drawing Sheets

(56) References Cited

U.S. PATENT DOCUMENTS

| | | |
|---|---|---|
| 4,093,943 A | 6/1978 | Knight |
| 4,151,387 A | 4/1979 | Peters, Jr. |
| 4,174,807 A | 11/1979 | Smith et al. |
| 4,197,571 A | 4/1980 | Grunert |
| 4,206,872 A | 6/1980 | Levine |
| 4,224,615 A | 9/1980 | Penz |
| 4,232,819 A | 11/1980 | Bost |
| 4,257,555 A | 3/1981 | Neel |
| 4,264,034 A | 4/1981 | Hyltin et al. |
| 4,274,045 A | 6/1981 | Goldstein |
| 4,296,334 A | 10/1981 | Wong |
| 4,298,946 A | 11/1981 | Hartsell et al. |
| 4,300,199 A | 11/1981 | Yoknis et al. |
| 4,308,991 A | 1/1982 | Peinetti et al. |
| 4,316,256 A | 2/1982 | Hendricks et al. |
| 4,332,352 A | 6/1982 | Jaeger |
| 4,337,822 A | 7/1982 | Hyltin et al. |
| 4,337,893 A | 7/1982 | Flanders et al. |
| 4,373,664 A | 2/1983 | Barker et al. |
| 4,379,483 A | 4/1983 | Farley |
| 4,382,544 A | 5/1983 | Stewart |
| 4,384,213 A | 5/1983 | Bogel |
| 4,386,649 A | 6/1983 | Hines et al. |
| 4,388,692 A | 6/1983 | Jones et al. |
| 4,431,134 A | 2/1984 | Hendricks et al. |
| 4,446,913 A | 5/1984 | Krocker |
| 4,479,604 A | 10/1984 | Didner |
| 4,503,471 A | 3/1985 | Hanajima et al. |
| 4,504,778 A | 3/1985 | Evans |
| 4,506,827 A | 3/1985 | Jamieson et al. |
| 4,556,169 A | 12/1985 | Zervos |
| 4,585,164 A | 4/1986 | Butkovich et al. |
| 4,606,401 A | 8/1986 | Levine et al. |
| 4,621,336 A | 11/1986 | Brown |
| 4,622,544 A | 11/1986 | Bially et al. |
| 4,628,201 A | 12/1986 | Schmitt |
| 4,641,013 A | 2/1987 | Dunnigan et al. |
| 4,646,964 A | 3/1987 | Parker et al. |
| 4,692,596 A | 9/1987 | Payne |
| 4,706,177 A * | 11/1987 | Josephson ............ H02H 7/1227 363/132 |
| 4,717,333 A | 1/1988 | Carignan |
| 4,725,001 A | 2/1988 | Carney et al. |
| 4,745,300 A | 5/1988 | Kammerer et al. |
| 4,745,311 A | 5/1988 | Iwasaki |
| 4,806,843 A | 2/1989 | Mertens et al. |
| 4,811,163 A | 3/1989 | Fletcher |
| 4,829,779 A | 5/1989 | Munson et al. |
| 4,837,731 A | 6/1989 | Levine et al. |
| 4,881,686 A | 11/1989 | Mehta |
| 4,918,439 A | 4/1990 | Wozniak et al. |
| 4,939,995 A | 7/1990 | Feinberg |
| 4,942,613 A | 7/1990 | Lynch |
| 4,948,040 A | 8/1990 | Kobayashi et al. |
| 4,969,508 A | 11/1990 | Tate et al. |
| 4,992,779 A | 2/1991 | Sugino et al. |
| 4,997,029 A | 3/1991 | Otsuka et al. |
| 5,005,365 A | 4/1991 | Lynch |
| 5,012,973 A | 5/1991 | Dick et al. |
| 5,025,134 A | 6/1991 | Bensoussan et al. |
| 5,036,698 A | 8/1991 | Conti |
| 5,038,851 A | 8/1991 | Mehta |
| 5,053,752 A | 10/1991 | Epstein et al. |
| 5,065,813 A | 11/1991 | Berkeley et al. |
| 5,081,411 A | 1/1992 | Walker |
| 5,086,385 A | 2/1992 | Launey et al. |
| 5,088,645 A | 2/1992 | Bell |
| 5,118,963 A | 6/1992 | Gesin |
| 5,120,983 A | 6/1992 | Samann |
| 5,140,310 A | 8/1992 | DeLuca et al. |
| 5,161,606 A | 11/1992 | Berkeley et al. |
| 5,170,935 A | 12/1992 | Federspiel et al. |
| 5,172,565 A | 12/1992 | Wruck et al. |
| 5,181,653 A | 1/1993 | Foster et al. |
| 5,187,797 A | 2/1993 | Nielsen et al. |
| 5,192,874 A | 3/1993 | Adams |
| 5,210,685 A | 5/1993 | Rosa |
| 5,221,877 A | 6/1993 | Falk |
| 5,226,591 A | 7/1993 | Ratz |
| 5,230,482 A | 7/1993 | Ratz et al. |
| 5,238,184 A | 8/1993 | Adams |
| 5,251,813 A | 10/1993 | Kniepkamp |
| 5,259,445 A | 11/1993 | Pratt et al. |
| 5,272,477 A | 12/1993 | Tashima et al. |
| 5,277,244 A | 1/1994 | Mehta |
| 5,289,047 A | 2/1994 | Broghammer |
| 5,294,849 A | 3/1994 | Potter |
| 5,329,991 A | 7/1994 | Mehta et al. |
| 5,348,078 A | 9/1994 | Dushane et al. |
| 5,351,035 A | 9/1994 | Chrisco |
| 5,361,009 A | 11/1994 | Lu |
| 5,386,577 A | 1/1995 | Zenda |
| 5,390,206 A | 2/1995 | Rein et al. |
| 5,404,934 A | 4/1995 | Carlson et al. |
| 5,414,618 A | 5/1995 | Mock et al. |
| 5,429,649 A | 7/1995 | Robin |
| 5,439,441 A | 8/1995 | Grimsley et al. |
| 5,452,197 A * | 9/1995 | Rice ....................... H02M 7/48 363/132 |
| 5,482,209 A | 1/1996 | Cochran et al. |
| 5,495,887 A | 3/1996 | Kathnelson et al. |
| 5,506,572 A | 4/1996 | Hills et al. |
| 5,526,422 A | 6/1996 | Keen |
| 5,537,106 A | 7/1996 | Mitsuhashi |
| 5,544,036 A | 8/1996 | Brown, Jr. et al. |
| 5,566,879 A | 10/1996 | Longtin |
| 5,570,837 A | 11/1996 | Brown et al. |
| 5,579,197 A | 11/1996 | Mengelt et al. |
| 5,590,831 A | 1/1997 | Manson et al. |
| 5,603,451 A | 2/1997 | Helander et al. |
| 5,654,813 A | 8/1997 | Whitworth |
| 5,668,535 A | 9/1997 | Hendrix et al. |
| 5,671,083 A | 9/1997 | Connor et al. |
| 5,673,850 A | 10/1997 | Uptegraph |
| 5,679,137 A | 10/1997 | Erdman et al. |
| 5,682,206 A | 10/1997 | Wehmeyer et al. |
| 5,711,785 A | 1/1998 | Maxwell |
| 5,732,691 A | 3/1998 | Maiello et al. |
| 5,736,795 A | 4/1998 | Zuehlke et al. |
| 5,761,083 A | 6/1998 | Brown, Jr. et al. |
| 5,782,296 A | 7/1998 | Mehta |
| 5,801,940 A | 9/1998 | Russ et al. |
| 5,810,908 A | 9/1998 | Gray et al. |
| 5,818,428 A | 10/1998 | Eisenbrandt et al. |
| 5,833,134 A | 11/1998 | Ho et al. |
| 5,839,654 A | 11/1998 | Weber |
| 5,840,094 A | 11/1998 | Osendorf et al. |
| 5,862,737 A | 1/1999 | Chin et al. |
| 5,873,519 A | 2/1999 | Beilfuss |
| 5,886,697 A | 3/1999 | Naughton et al. |
| 5,899,866 A | 5/1999 | Cyrus et al. |
| 5,902,183 A | 5/1999 | D'Souza |
| 5,903,139 A | 5/1999 | Kompelien |
| 5,909,429 A | 6/1999 | Satyanarayana et al. |
| 5,915,473 A | 6/1999 | Ganesh et al. |
| 5,917,141 A | 6/1999 | Naquin, Jr. |
| 5,917,416 A | 6/1999 | Read |
| D413,328 S | 8/1999 | Kazama |
| 5,937,942 A | 8/1999 | Bias et al. |
| 5,947,372 A | 9/1999 | Tiernan |
| 5,950,709 A | 9/1999 | Krueger et al. |
| 6,009,355 A | 12/1999 | Obradovich et al. |
| 6,013,121 A | 1/2000 | Chin et al. |
| 6,018,700 A | 1/2000 | Edel |
| 6,020,881 A | 2/2000 | Naughton et al. |
| 6,032,867 A | 3/2000 | Dushane et al. |
| D422,594 S | 4/2000 | Henderson et al. |
| 6,059,195 A | 5/2000 | Adams et al. |
| 6,081,197 A | 6/2000 | Garrick et al. |
| 6,084,523 A | 7/2000 | Gelnovatch et al. |
| 6,089,221 A | 7/2000 | Mano et al. |
| 6,101,824 A | 8/2000 | Meyer et al. |
| 6,104,963 A | 8/2000 | Cebasek et al. |
| 6,119,125 A | 9/2000 | Gloudeman et al. |

(56) References Cited

U.S. PATENT DOCUMENTS

| | | |
|---|---|---|
| 6,121,875 A | 9/2000 | Hamm et al. |
| 6,140,987 A | 10/2000 | Stein et al. |
| 6,141,595 A | 10/2000 | Gloudeman et al. |
| 6,145,751 A | 11/2000 | Ahmed |
| 6,149,065 A | 11/2000 | White et al. |
| 6,152,375 A | 11/2000 | Robison |
| 6,154,081 A | 11/2000 | Pakkala et al. |
| 6,167,316 A | 12/2000 | Gloudeman et al. |
| 6,190,442 B1 | 2/2001 | Redner |
| 6,192,282 B1 | 2/2001 | Smith et al. |
| 6,196,467 B1 | 3/2001 | Dushane et al. |
| 6,205,041 B1 | 3/2001 | Baker |
| 6,208,331 B1 | 3/2001 | Singh et al. |
| 6,216,956 B1 | 4/2001 | Ehlers et al. |
| 6,236,326 B1 | 5/2001 | Murphy |
| 6,259,074 B1 | 7/2001 | Brunner et al. |
| 6,260,765 B1 | 7/2001 | Natale et al. |
| 6,285,912 B1 | 9/2001 | Ellison et al. |
| 6,288,458 B1 | 9/2001 | Berndt |
| 6,290,140 B1 | 9/2001 | Pesko et al. |
| D448,757 S | 10/2001 | Okubo |
| 6,315,211 B1 | 11/2001 | Sartain et al. |
| 6,318,639 B1 | 11/2001 | Toth |
| 6,321,637 B1 | 11/2001 | Shanks et al. |
| 6,330,806 B1 | 12/2001 | Beaverson et al. |
| 6,344,861 B1 | 2/2002 | Naughton et al. |
| 6,351,693 B1 | 2/2002 | Monie et al. |
| 6,356,038 B2 | 3/2002 | Bishel |
| 6,385,510 B1 | 5/2002 | Hoog et al. |
| 6,394,359 B1 | 5/2002 | Morgan |
| 6,397,612 B1 | 6/2002 | Kernkamp et al. |
| 6,398,118 B1 | 6/2002 | Rosen et al. |
| 6,448,896 B1 | 9/2002 | Bankus et al. |
| 6,449,726 B1 | 9/2002 | Smith |
| 6,453,687 B2 | 9/2002 | Sharood et al. |
| D464,948 S | 10/2002 | Vasquez et al. |
| 6,460,774 B2 | 10/2002 | Sumida et al. |
| 6,466,132 B1 | 10/2002 | Caronna et al. |
| 6,478,233 B1 | 11/2002 | Shah |
| 6,490,174 B1 | 12/2002 | Kompelien |
| 6,502,758 B2 | 1/2003 | Cottrell |
| 6,507,282 B1 | 1/2003 | Sherwood |
| 6,512,209 B1 | 1/2003 | Yano |
| 6,518,953 B1 | 2/2003 | Armstrong |
| 6,518,957 B1 | 2/2003 | Lehtinen et al. |
| 6,546,419 B1 | 4/2003 | Humpleman et al. |
| 6,556,899 B1 | 4/2003 | Harvey et al. |
| 6,566,768 B2 | 5/2003 | Zimmerman et al. |
| 6,574,537 B2 | 6/2003 | Kipersztok et al. |
| 6,578,770 B1 | 6/2003 | Rosen |
| 6,580,950 B1 | 6/2003 | Johnson et al. |
| 6,581,846 B1 | 6/2003 | Rosen |
| 6,587,739 B1 | 7/2003 | Abrams et al. |
| 6,595,430 B1 | 7/2003 | Shah |
| 6,596,059 B1 | 7/2003 | Greist et al. |
| D478,051 S | 8/2003 | Sagawa |
| 6,608,560 B2 | 8/2003 | Abrams |
| 6,619,055 B1 | 9/2003 | Addy |
| 6,619,555 B2 | 9/2003 | Rosen |
| 6,621,507 B1 | 9/2003 | Shah |
| 6,622,925 B2 | 9/2003 | Carner et al. |
| 6,635,054 B2 | 10/2003 | Fjield et al. |
| 6,663,010 B2 | 12/2003 | Chene et al. |
| 6,671,533 B2 | 12/2003 | Chen et al. |
| 6,685,098 B2 | 2/2004 | Okano et al. |
| 6,702,811 B2 | 3/2004 | Stewart et al. |
| 6,726,112 B1 | 4/2004 | Ho |
| D492,282 S | 6/2004 | Lachello et al. |
| 6,771,996 B2 | 8/2004 | Bowe et al. |
| 6,783,079 B2 | 8/2004 | Carey et al. |
| 6,786,421 B2 | 9/2004 | Rosen |
| 6,789,739 B2 | 9/2004 | Rosen |
| 6,801,849 B2 | 10/2004 | Szukala et al. |
| 6,807,041 B2 | 10/2004 | Geiger et al. |
| 6,808,524 B2 | 10/2004 | Lopath et al. |
| 6,810,307 B1 | 10/2004 | Addy |
| 6,810,397 B1 | 10/2004 | Qian et al. |
| 6,824,069 B2 | 11/2004 | Rosen |
| 6,833,990 B2 | 12/2004 | LaCroix et al. |
| 6,842,721 B2 | 1/2005 | Kim et al. |
| 6,851,621 B1 | 2/2005 | Wacker et al. |
| 6,868,293 B1 | 3/2005 | Schurr et al. |
| 6,893,438 B2 | 5/2005 | Hall et al. |
| 6,934,862 B2 | 8/2005 | Sharood et al. |
| D512,208 S | 12/2005 | Kubo et al. |
| 6,973,410 B2 | 12/2005 | Seigel |
| 7,001,495 B2 | 2/2006 | Essalik et al. |
| D520,989 S | 5/2006 | Miller |
| 7,050,026 B1 | 5/2006 | Rosen |
| 7,055,759 B2 | 6/2006 | Wacker et al. |
| 7,080,358 B2 | 7/2006 | Kuzmin |
| 7,083,109 B2 | 8/2006 | Pouchak |
| 7,083,189 B2 | 8/2006 | Ogata |
| 7,084,774 B2 | 8/2006 | Martinez |
| 7,089,088 B2 | 8/2006 | Terry et al. |
| 7,108,194 B1 | 9/2006 | Hankins, II |
| 7,130,719 B2 | 10/2006 | Ehlers et al. |
| D531,588 S | 11/2006 | Peh |
| 7,133,748 B2 | 11/2006 | Robinson |
| D533,515 S | 12/2006 | Klein et al. |
| 7,146,253 B2 | 12/2006 | Hoog et al. |
| 7,152,806 B1 | 12/2006 | Rosen |
| 7,156,318 B1 | 1/2007 | Rosen |
| 7,163,156 B2 | 1/2007 | Kates |
| 7,188,002 B2 | 3/2007 | Chapman, Jr. et al. |
| D542,236 S | 5/2007 | Klein et al. |
| 7,212,887 B2 | 5/2007 | Shah et al. |
| 7,222,800 B2 | 5/2007 | Wruck et al. |
| 7,225,054 B2 | 5/2007 | Amundson et al. |
| 7,231,605 B1 | 6/2007 | Ramakasavan |
| 7,232,075 B1 | 6/2007 | Rosen |
| 7,240,289 B2 | 7/2007 | Naughton et al. |
| 7,244,294 B2 | 7/2007 | Kates |
| 7,261,762 B2 | 8/2007 | Kang et al. |
| 7,263,283 B2 | 8/2007 | Knepler |
| 7,274,973 B2 | 9/2007 | Nichols et al. |
| 7,302,642 B2 | 11/2007 | Smith et al. |
| 7,331,187 B2 | 2/2008 | Kates |
| 7,331,426 B2 | 2/2008 | Jahkonen |
| 7,341,201 B2 | 3/2008 | Stanimirovic |
| 7,354,005 B2 | 4/2008 | Carey et al. |
| RE40,437 E | 7/2008 | Rosen |
| 7,419,532 B2 | 9/2008 | Sellers et al. |
| 7,435,278 B2 | 10/2008 | Terlson |
| 7,451,606 B2 | 11/2008 | Harrod |
| 7,452,396 B2 | 11/2008 | Terlson et al. |
| 7,476,988 B2 | 1/2009 | Mulhouse et al. |
| 7,489,094 B2 | 2/2009 | Steiner et al. |
| 7,496,627 B2 | 2/2009 | Moorer et al. |
| 7,500,026 B2 | 3/2009 | Fukanaga et al. |
| 7,505,914 B2 | 3/2009 | McCall |
| 7,542,867 B2 | 6/2009 | Steger et al. |
| 7,556,207 B2 | 7/2009 | Mueller et al. |
| 7,574,283 B2 | 8/2009 | Wang et al. |
| 7,584,897 B2 | 9/2009 | Schultz et al. |
| 7,594,960 B2 | 9/2009 | Johansson |
| 7,595,613 B2 | 9/2009 | Thompson et al. |
| 7,600,694 B2 | 10/2009 | Helt et al. |
| 7,604,046 B2 | 10/2009 | Bergman et al. |
| 7,617,691 B2 | 11/2009 | Street et al. |
| 7,642,674 B2 | 1/2010 | Mulhouse et al. |
| 7,644,591 B2 | 1/2010 | Singh et al. |
| 7,665,019 B2 | 2/2010 | Jaeger |
| 7,676,282 B2 | 3/2010 | Bosley |
| 7,692,559 B2 | 4/2010 | Face et al. |
| 7,707,189 B2 | 4/2010 | Haselden et al. |
| 7,713,339 B2 | 5/2010 | Johansson |
| 7,739,282 B1 | 6/2010 | Smith et al. |
| 7,755,220 B2 | 7/2010 | Sorg et al. |
| 7,770,242 B2 | 8/2010 | Sell |
| 7,786,620 B2 | 8/2010 | Vuk et al. |
| 7,793,056 B2 | 9/2010 | Boggs et al. |
| 7,814,516 B2 | 10/2010 | Stecyk et al. |
| 7,837,676 B2 | 11/2010 | Sinelnikov et al. |

(56) References Cited

U.S. PATENT DOCUMENTS

| | | |
|---|---|---|
| 7,838,803 B1 | 11/2010 | Rosen |
| 7,852,645 B2 | 12/2010 | Fouquet et al. |
| 7,859,815 B2 | 12/2010 | Black et al. |
| 7,865,252 B2 | 1/2011 | Clayton |
| 7,941,431 B2 | 5/2011 | Bluhm et al. |
| 7,952,485 B2 | 5/2011 | Schecter et al. |
| 7,956,719 B2 | 6/2011 | Anderson, Jr. et al. |
| 7,957,775 B2 | 6/2011 | Allen, Jr. et al. |
| 7,984,220 B2 | 7/2011 | Gerard et al. |
| 7,992,764 B2 | 8/2011 | Magnusson |
| 7,992,794 B2 | 8/2011 | Leen et al. |
| 8,032,254 B2 | 10/2011 | Amundson et al. |
| 8,060,470 B2 | 11/2011 | Davidson et al. |
| 8,087,593 B2 | 1/2012 | Leen |
| 8,091,796 B2 | 1/2012 | Amundson et al. |
| 8,110,945 B2 | 2/2012 | Simard et al. |
| 8,138,634 B2 | 3/2012 | Ewing et al. |
| 8,167,216 B2 | 5/2012 | Schultz et al. |
| 8,183,818 B2 | 5/2012 | Elhalis |
| 8,216,216 B2 | 7/2012 | Warnking et al. |
| 8,219,249 B2 | 7/2012 | Harrod et al. |
| 8,239,066 B2 | 8/2012 | Jennings et al. |
| 8,276,829 B2 | 10/2012 | Stoner et al. |
| 8,280,556 B2 | 10/2012 | Besore et al. |
| 8,314,517 B2 | 11/2012 | Simard et al. |
| 8,346,396 B2 | 1/2013 | Amundson et al. |
| 8,417,091 B2 | 4/2013 | Kim et al. |
| 8,437,878 B2 | 5/2013 | Grohman et al. |
| 8,511,577 B2 | 8/2013 | Warren et al. |
| 8,523,083 B2 | 9/2013 | Warren et al. |
| 8,532,190 B2 | 9/2013 | Shimizu et al. |
| 8,554,374 B2 | 10/2013 | Lunacek et al. |
| 8,574,343 B2 | 11/2013 | Bisson et al. |
| 8,613,792 B2 | 12/2013 | Ragland et al. |
| 8,621,881 B2 | 1/2014 | Votaw et al. |
| 8,623,117 B2 | 1/2014 | Zavodny et al. |
| 8,629,661 B2 * | 1/2014 | Shimada ............ H02M 3/33507 307/66 |
| 8,680,442 B2 | 3/2014 | Reusche et al. |
| 8,704,672 B2 | 4/2014 | Hoglund et al. |
| 8,729,875 B2 | 5/2014 | Vanderzon |
| 8,731,723 B2 | 5/2014 | Boll et al. |
| 8,734,565 B2 | 5/2014 | Hoglund et al. |
| 8,752,771 B2 | 6/2014 | Warren et al. |
| 8,768,341 B2 | 7/2014 | Coutelou et al. |
| 8,881,172 B2 | 11/2014 | Schneider |
| 8,886,179 B2 | 11/2014 | Pathuri et al. |
| 8,886,314 B2 | 11/2014 | Crutchfield et al. |
| 8,892,223 B2 | 11/2014 | Leen et al. |
| 8,902,071 B2 | 12/2014 | Barton et al. |
| 9,002,523 B2 | 4/2015 | Erickson et al. |
| 9,071,145 B2 | 6/2015 | Simard et al. |
| 9,080,784 B2 | 7/2015 | Dean-Hendricks et al. |
| 9,098,279 B2 | 8/2015 | Mucignat et al. |
| 9,143,006 B2 | 9/2015 | Lee et al. |
| 9,206,993 B2 | 12/2015 | Barton et al. |
| 9,234,877 B2 | 1/2016 | Hattersley et al. |
| 9,261,287 B2 | 2/2016 | Warren et al. |
| 9,264,035 B2 | 2/2016 | Tousignant et al. |
| 9,272,647 B2 | 3/2016 | Gawade et al. |
| 9,366,448 B2 | 6/2016 | Dean-Hendricks et al. |
| 9,374,268 B2 | 6/2016 | Budde et al. |
| 9,419,602 B2 | 8/2016 | Tousignant et al. |
| 2001/0029585 A1 | 10/2001 | Simon et al. |
| 2001/0052459 A1 | 12/2001 | Essalik et al. |
| 2002/0011923 A1 | 1/2002 | Cunningham et al. |
| 2002/0022991 A1 | 2/2002 | Sharood et al. |
| 2002/0082746 A1 | 6/2002 | Schubring et al. |
| 2002/0092779 A1 | 7/2002 | Essalik et al. |
| 2003/0033230 A1 | 2/2003 | McCall |
| 2003/0034897 A1 | 2/2003 | Shamoon et al. |
| 2003/0034898 A1 | 2/2003 | Shamoon et al. |
| 2003/0040279 A1 | 2/2003 | Ballweg |
| 2003/0060821 A1 | 3/2003 | Hall et al. |
| 2003/0103075 A1 | 6/2003 | Rosselot |
| 2003/0177012 A1 | 9/2003 | Drennan |
| 2004/0262410 A1 | 12/2004 | Hull |
| 2005/0083168 A1 | 4/2005 | Breitenbach |
| 2005/0270151 A1 | 12/2005 | Winick |
| 2006/0112700 A1 | 6/2006 | Choi et al. |
| 2006/0196953 A1 | 9/2006 | Simon et al. |
| 2006/0242591 A1 | 10/2006 | Van Dok et al. |
| 2007/0013534 A1 | 1/2007 | DiMaggio |
| 2007/0045429 A1 | 3/2007 | Chapman, Jr. et al. |
| 2007/0114293 A1 | 5/2007 | Gugenheim |
| 2007/0114295 A1 | 5/2007 | Jenkins et al. |
| 2007/0119961 A1 | 5/2007 | Kaiser |
| 2007/0241203 A1 | 10/2007 | Wagner et al. |
| 2007/0277061 A1 | 11/2007 | Ashe |
| 2007/0289731 A1 | 12/2007 | Deligiannis et al. |
| 2007/0290924 A1 | 12/2007 | McCoy |
| 2007/0296260 A1 | 12/2007 | Stossel |
| 2008/0015740 A1 | 1/2008 | Osann |
| 2009/0143880 A1 | 6/2009 | Amundson et al. |
| 2009/0165644 A1 | 7/2009 | Campbell |
| 2010/0084482 A1 | 4/2010 | Kennedy et al. |
| 2010/0204834 A1 | 8/2010 | Comerford et al. |
| 2011/0073101 A1 | 3/2011 | Lau et al. |
| 2011/0185895 A1 | 8/2011 | Freen |
| 2012/0323377 A1 | 12/2012 | Hoglund et al. |
| 2013/0158714 A1 | 6/2013 | Barton et al. |
| 2013/0158715 A1 | 6/2013 | Barton et al. |
| 2013/0158717 A1 | 6/2013 | Zywicki et al. |
| 2013/0158718 A1 | 6/2013 | Barton et al. |
| 2013/0158720 A1 | 6/2013 | Zywicki et al. |
| 2013/0213952 A1 | 8/2013 | Boutin et al. |
| 2013/0238142 A1 | 9/2013 | Nichols et al. |
| 2013/0245838 A1 | 9/2013 | Zywicki et al. |
| 2013/0261807 A1 | 10/2013 | Zywicki et al. |
| 2014/0062672 A1 | 3/2014 | Gudan et al. |
| 2014/0312131 A1 | 10/2014 | Tousignant et al. |
| 2014/0312697 A1 | 10/2014 | Landry et al. |
| 2015/0001930 A1 | 1/2015 | Juntunen et al. |
| 2015/0115045 A1 | 4/2015 | Tu et al. |
| 2015/0144706 A1 | 5/2015 | Robideau et al. |
| 2015/0370265 A1 | 12/2015 | Ren et al. |
| 2015/0370268 A1 | 12/2015 | Tousignant et al. |
| 2016/0010880 A1 | 1/2016 | Bravard et al. |

FOREIGN PATENT DOCUMENTS

| | | |
|---|---|---|
| EP | 0070414 A1 | 1/1983 |
| EP | 0434926 B1 | 8/1995 |
| EP | 0678204 B1 | 3/2000 |
| EP | 0985994 A1 | 3/2000 |
| EP | 1033641 A1 | 9/2000 |
| EP | 1143232 A1 | 10/2001 |
| EP | 1074009 B1 | 3/2002 |
| EP | 2138919 A1 | 12/2009 |
| FR | 2491692 A1 | 4/1982 |
| FR | 2711230 A1 | 4/1995 |
| WO | 9711448 A1 | 3/1997 |
| WO | 9739392 A1 | 10/1997 |
| WO | 0043870 A2 | 7/2000 |
| WO | 0152515 A1 | 7/2001 |
| WO | 0179952 A1 | 10/2001 |
| WO | 0223744 A2 | 3/2002 |
| WO | 2010021700 A1 | 2/2010 |

OTHER PUBLICATIONS

U.S. Appl. No. 14/300,232, filed Jun. 9, 2014.
U.S. Appl. No. 14/301,175, filed Jun. 10, 2014.
U.S. Appl. No. 14/088,312, filed Nov. 22, 2013.
"RCS X10 Thermostat Plug-in for HomeSeer Beta Version 2.0. 105," 25 pages, prior to Sep. 7, 2011.
"CorAccess Systems/In Home," http://web.archive.org/web20011212084427/www.coraccess.com/home.html, 1 page, copyright 2001, printed Aug. 19, 2004.
"HAI Company Background," http://www.homeauto.com/AboutHAI/abouthai_main.htm, 2 pages, printed Aug. 19, 2004.

(56) References Cited

OTHER PUBLICATIONS

"High-tech options take hold in new homes—200-08-28—Dallas Business Journal," http://bizjournals.com/dallas/stories/2000/08/28/focus4, 3 pages, dated Aug. 28, 2000, printed Aug. 19, 2004.
"Home Toys Review—TouchLinc", http://www.hometoys.com/htinews/aug99/reviews/touchlinc/touchlinc.htm, 3 pages, dated Aug. 1999, printed Aug. 20, 2004.
"HTI News Release," http://www.hometoys.com/htinews/apr99/releases/ha101.htm, 3 pages, Apr. 1999.
"Mark of Excellence Award Finalist Announced," http://64.233.167.104/search?Q=cache:ciOA2YtYaBIJ:www.hometoys.com/releases/mar. . . , 6 pages, Leopard Touchscreen on p. 2, dated prior to Mar. 4, 2000, printed Aug. 20, 2004.
"Product Review—Philips Pronto Remote Control," http://hometheaterhifi.com/volume_6_2/philipsprontoremotecontrol.html, 5 pages, dated May 1999, printed Aug. 20, 2004.
"RC X10 Automation Forum: Control your Heating and Cooling System with Pronto(1/1)," http://www.remotecentral.com/cgi-bin/mboard/rc-x10/thread.cgi?12, 2 pages, dated Apr. 23, 1999, printed Aug. 20, 2004.
"Spotlight on integrated systems," Custom Builder, vol. 8, No. 2, p. 66(6), Mar.-Apr. 1993.
"Vantage Expands Controls for Audio/Video, HVAC and Security," http://www.hometoys.com/htinews/aug99/releases/vantage03.htm, 2 pages, dated Aug. 3, 1999, printed Aug. 20, 2004.
ADI, "Leopard User Manual," 93 pages, 2001.
Adicon 2500, "The Automator," 4 pages, Oct.-Dec. 2000.
ADT Security Services, "iCenter Advanced User Interface 8142ADT," Installation and Setup Guide, 4 pages, May 2001; First Sale Feb. 2001.
AED Electronics, Inc., "Presenting Climatouch the Most Innovative Thermostat in the World!," 2 pages, prior to Nov. 30, 2007.
Andrews et al., "Clicky: User-Centric Input for Active Spaces," 17 pages, Aug. 2004.
Aprilaire Electronic Thermostats Models 8344, 8346, 8348, 8363, 8365, 8366 Operating Instructions, 8 pages, 2003.
Aube Technologies, Electronic Thermostat for Heating System Model TH135-01, 5 pages, Aug. 14, 2001.
Aube Technologies, TH140-28 Electronic Programmable Thermostat, Installation Instructions and User Guide, pp. 1-4, Jan. 22, 2004.
AutomatedBuildings.com Article—"Thin Client" Solutions, "Pressure, Air Flow, Temperature, Humidity & Valves," Dwyer Instruments, Inc., 5 pages, printed Sep. 20, 2004.
Blake et al., "Seng 310 Final Project Demo Program" Illustration, 3 pages, Apr. 6, 2001.
Blake et al., "Seng 310 Final Project" Report, dated Apr. 6, 2001.
Blister Pack Insert from a Ritetemp 8082 Touch Screen Thermostat Product, 2 pages, 2002.
Braeburn Model 3000 Owner's Manual, pp. 1-13, 2001.
Braeburn Model 5000 Owner's Manual, pp. 1-17, 2001.
BRK Electronics Maximum Protection Plus Ultimate Convenience Smoke Alarm, 24 pages, Sep. 2000.
BRK First Alert, User's Manual, Smoke and Fire Alarms, pp. 1-7, Nov. 2002.
Business Wire, "MicroTouch Specialty Products Group to Capitalize on Growing Market for Low-Cost Digital Matrix Touchscreens," p. 1174 (2 pages), Jan. 6, 1999.
Cardio Manual, available at http://www.secant.ca/En/Documentation/Cardio2é-Manual.pdf, Cardio Home Automation Inc., 55 pages, printed Sep. 28, 2004.
Cardio, by Secant; http://www.hometoys.com/htinews/apr98/reviews/cardio.htm, "HTINews Review," Feb. 1998, 5 pages, printed Sep. 14, 2004.
Carrier Microelectronic Programmable Thermostat Owner's Manual, pp. 1-24, May 1994.
Carrier TSTATCCRF01 Programmable Digital Thermostat, pp. 1-21, prior to Apr. 21, 2005.
Carrier, "Edge Performance Programmable Owner's Manual," 64 pages, 2007.
Carrier, "Programmable Dual Fuel Thermostats," Installation, Start-Up & Operating Instructions, pp. 1-12, Oct. 1998.
Carrier, "Programmable Thermostats," Installation, Start-Up & Operating Instructions, pp. 1-16, Sep. 1998.
Carrier, "Standard Programmable Thermostat," Homeowner's Manual, pp. 1-8 pages, 1998.
Carrier, "Thermidistat Control, Installation, Start-Up, and Operating Instructions," pp. 1-12, Aug. 1999.
Carrier, "Comfort Programmable Owner's Manual," Carrier Touch-N-Go, Catalog No. 0M-TCPHP-4CA 60 pages, 2010.
Cirrus Logic, Inc., "CS1501 Digital Power Factor Correction Control IC," 16 pages, 2012.
Climatouch, User Manual, Climatouch CT03TSB Thermostat, Climatouch CT03TSHB Thermostat with Humidity Control, Outdoor UHF Temperature Transmitter 217S31, 19 pages, Printed Sep. 15, 2004.
International Search Report for Corresponding Application No. PCT/US2014/044229, dated Oct. 13, 2014.
CorAccess, "Companion 6," User Guide, pp. 1-20, Jun. 17, 2002.
Danfoss RT51/51RF & RT52/52RF User Instructions, 2 pages, Jun. 2004.
DeKoven et al., "Designing Collaboration in Consumer Products," 2 pages, 2001.
DeKoven et al., "Measuring Task Models in Designing Intelligent Products," 2 pages, Jan. 13-16, 2002.
DESA Heating Products, "Wireless Hand-Held Remote Control Sets Models (C) GHRCB and (C)GHRCTB, Operating Instructions," 4 pages, May 2003.
Domotique Secant Home Automation—Web Page, available at http://www.secant.ca/En/Company/Default.asp, 1 page, printed Sep. 28, 2004.
Emme Core User Guide, Version 1.1, 47 pages, Jan. 2011.
Firex Smoke Alarm, Ionization Models AD, ADC Photoelectric Model Pad, 4 pages, prior to Apr. 21, 2005.
Fluke, "561 HVAC Pro" Infrared Thermometer User's Manual, 22 pages, Downloaded May 24, 2012.
Freudenthal et al., "Communicating Extensive Smart Home Functionality to Users of All Ages: the Design of a Mixed-Initiative Multimodal Thermostat-Interface," pp. 34-39, Mar. 12-13, 2001.
Gentex Corporation, HD135, 135° Fixed Temperature Heat Detector AC Pwered, 120V, 60Hz With Battery Backup, Installation Instructions—Owner's Information, pp. 1-5, Jun. 1, 1998.
Gentex Corporation, 9000 Series, Photoelectric Type Single Station/Multi-Station Smoke Alarms AC Powered With Battery Backup, Installation Instructions—Owner's Information, pp. 9-1 to 9-6, Jan. 1, 1993.
Harris et al., "Optimizing Memory Transactions," Microsoft Research Havard University, 12 pages, May 25, 2012.
Hendon Semiconductors, "OM1894 Dual Sensing Precision Triac Control," Product Specification, Rev. 2.0, 21 pages, Apr. 19, 2007.
Honeywell Brivis Deluxe Programmable Thermostat, pp. 1-20, 2002.
Honeywell Brivis T8602C Chronotherm IV Deluxe Programmable Thermostats, Installation Instructions, pp. 1-12, 2002.
Honeywell CT8602C Professional Fuel Saver Thermostat, pp. 1-6, 1995.
Honeywell Electronic Programmable Thermostat, Owner's Guide, pp. 1-20, 2003.
Honeywell Electronic Programmable Thermostats, Installation Instructions, pp. 1-8, 2003.
Honeywell News Release, "Honeywell's New Sysnet Facilities Integration System for Boiler Plant and Combustion Safety Processes," 4 pages, Dec. 15, 1995.
Honeywell T8002 Programmable Thermostat, Installation Instructions, pp. 1-8, 2002.
Honeywell T8602A,B,C,D and TS8602A,C Chronotherm III Fuel Saver Thermostats, Installation Instructions, pp. 1-12, 1995.
Honeywell T8602D Chronotherm IV Deluxe Programmable Thermostats, Installation Instructions, pp. 1-12, 2002.
Honeywell TH8000 Series Programmable Thermostats, Owner's Guide, pp. 1-44, 2004.
Honeywell, "Excel Building Supervisor-Integrated R7044 and FS90 Ver. 2.0," Operator Manual, 70 pages, Apr. 1995.

(56) References Cited

OTHER PUBLICATIONS

Honeywell, "Installation Guide: Wireless Entry/Exit Remote," 12 pages, 2011.
Honeywell, "Introduction of the S7350A Honeywell WebPAD Information Appliance," Home and Building Control Bulletin, 2 pages, Aug. 29, 2000; Picture of WebPad Device with touch screen, 1 page; and screen shots of WebPad Device, 4 pages.
Honeywell, "RedLINK™ Wireless Comfort Systems," RedLINK Wireless Technology, 8 pages, Aug. 2011.
Honeywell, "System Installation Guide: Important Instructions," Honeywell International Inc., 25 pages, 2011.
Honeywell, "Total Connect Online Help Guide," Revision A, 800-02577-TC, Mar. 2010.
Honeywell, "Total Connect User Guide," Revision B, 34 pages, May 15, 2012.
Honeywell, "VisionPRO® 8000 Thermostats," downloaded from http://yourhome.honeywell.com, 2 pages, May 24, 2012.
Honeywell, "W7006A Home Controller Gateway User Guide," 31 pages, Jul. 2001.
Honeywell, MagicStat® CT3200 Programmable Thermostat, Installation and Programming Instructions, pp. 1-24, 2001.
Honeywell, Wireless Entry/Exit Remote, Operating Manual, 9 pages, 2011.
http://hunter-thermostats.com/hunter_programmable_thermostats.html, Hunter Thermostat 44668 Specifications, and 44758 Specifications, 2 pages, Printed Jul. 13, 2011.
http://www.cc.gatech.edu/computing/classes/cs6751_94_fall/groupc/climate-2/node1.html, "Contents," 53 pages, printed Sep. 20, 2004.
http://www.dimplex.com/en/home_heating/linear_convector_baseboards/products/lpc_series/linear_proportional_convector, Dimplex Coporation, "Linear Convector LPC Series," 2 pages, May 2011.
http://www.enernetcorp.com/, Enernet Corporation, "Wireless Temperature Control" 1 page, 2011.
http://www.enernetcorp.com/t9000-wireless-thermostat.html, Enernet Corporation, "T9000 Series Wireless Fan Coil Thermostat," Product Brochure, 2 pages, 2011.
http://www.enocean-alliance.org/en/products/regulvar_rw-ssr347-15a/, Regulvar Corporation, "RW-SSR347-15A, Relais sans fil à semi-conducteurs" 3 pages, Aug. 8, 2009.
http://www.enocean-alliance.org/en/products/regulvar_rw-tp01/, Regulvar Corporation, "RW-TP01, Capteur de température sans fir" 3 pages, Aug. 9, 2009.
http://www.forwardthinking.honeywell.com/products/wireless/focus_pro/focus_pro_feature.html, Honeywell Corporation, "Wireless FocusPRO® pages", 2 pages, 2011.
http://www.ritetemp.info/rtMenu_13.html, Rite Temp 8082, 6 pages, printed Jun. 20, 2003.
http://www.thermostatsales.com, Robertshaw, "9610 Digital Programmable Thermostat," 3 pages, printed Jun. 17, 2004.
http://www.thermostatsales.com, Robertshaw, "9700 Deluxe Programmable Thermostat" 3 pages, printed Jun. 17, 2004.
http://www.thermostatsales.com, Robertshaw, "9710 Deluxe Programmable Thermostat," 3 pages, printed Jun. 17, 2004.
http://www.thermostatsales.com, Robertshaw, "9720 Deluxe Programmable Thermostat," 3 pages, printed Jun. 17, 2004.
Hunter, "44200/44250," Owner's Manual, 32 pages, prior to Jul. 7, 2004.
Hunter, "44300/44350," Owner's Manual, 35 pages, prior to Jul. 7, 2004.
Hunter, "Auto Saver 550", Owner's Manual Model 44550, 44 pages, prior to Jul. 7, 2004.
Hunter, "Model 44758 Remote Sensor," Owner's Manual, 2 pages, Revision Sep. 4, 2008.
Install Guide for Ritetemp Thermostat 8082, 6 pages, 2002.
Invensys™, "9700i 9701i 9715i 9720i Deluxe Programmable Thermostats," User's Manual, pp. 1-28, prior to Jul. 7, 2004.
Inventek, "Inventek Systems, ISM4319-M3X-L44-X Embedded Serial-to-Wi-Fi Module eS-WiFi 802.11 b/g/n Data Sheet",
Inventek, "Inventek Systems, ISM4319-M3X-L44-X Embedded Serial-to-Wi-Fi Module eS-WiFi 802.11 b/g/n Data Sheet", accessed from http://www.inventeksys.com/wp-content/uplo . . . Feb. 6, 2012.
Larsson, "Battery Supervision in Telephone Exchanges," Ericsson Components AB Sweden, 5 pages, Downloaded May 5, 2012.
Lennox, "Network Control Panel (NCP)," User's Manual, 18 pages, Nov. 1999.
Lennox, "Prodigy Control System," Lennox Industries, 4 pages, May 25, 2012.
Logitech, "Harmony 880 Remote User Manual," v. 1, pp. 1-15, prior to Nov. 30, 2007.
Lux ELV1 Programmable Line Voltage Thermostat, Installation Instructions, 3 pages, prior to Jul. 7, 2004.
Lux TX500 Series Smart Temp Electronic Thermostat, 3 pages, prior to Jul. 7, 2004.
Lux TX9000 Installation, 3 pages, prior to Apr. 21, 2005.
Lux, "9000RF Remote Instructions," 2 pages, prior to Nov. 30, 2007.
Lux, "511 Series Smart Temp Electronic Thermostat," Owner's Manual, 3 pages, prior to Jul. 7, 2004.
Lux, "600 Series Smart Temp Electronic Thermostat," Owner's Manual, 3 pages, prior to Jul. 7, 2004.
Lux, "602 Series Multi-Stage Programmable Thermostat," Owner's Manual, 2 pages, prior to Jul. 7, 2004.
Lux, "605/2110 Series Programmable Heat Pump Thermostat," Owner's Manual, 3 pages, prior to Jul. 7, 2004.
Lux, "700/9000 Series Smart Temp Electronic Thermostat," Owner's Manual, 3 pages, prior to Jul. 7, 2004.
Lux, "PSPH521 Series Programmable Heat Pump Thermostat," Owner's Manual, 3 pages, prior to Jul. 7, 2004.
Lux, "TX1500 Series Smart Temp Electronic Thermostat," Owner's Manual, 6 pages, prior to Jul. 7, 2004.
METASYS, "HVAC PRO for Windows User's Manual," 308 pages, 1998.
Mounting Template for Ritetemp Thermostat 8082, 1 page, 2002.
OMRON Electronic Components, LLC, "Micro Tilt Sensor D6B," Cat. No. B02WAD1, 2 pages, Jun. 2002.
OMRON Electronic Components, LLC, "Micro Tilt Sensor D6B," Cat. No. JB301-E3-01, 6 pages, Mar. 2005.
Operation Manual for Ritetemp Touch Screen Thermostat 8082, 8 pages, 2002.
PG&E, "SmartAC Thermostat Programming Web Site Guide," 2 pages, prior to Sep. 7, 2011.
Proliphix, "Web Enabled IP Thermostats, Intelligent HVAC Control," Proliphix Inc., 2 pages, on or before Aug. 28, 2004.
Proliphix, "Web Enabled IP Thermostats, Ultimate in Energy Efficiency!," Proliphix Inc., 2 pages, on or before Aug. 28, 2004.
Proliphix, Inc., "NT10e & NT20e," 54 pages, on or before Aug. 30, 2005.
Quick Start Guide for Ritetemp Thermostat 8082, 1 page, 2002.
Remote Control Power Requirement for Ritetemp Thermostat 8082, 1 page, 2002.
Ritetemp Operation 8029, 3 pages, Jun. 19, 2002.
Ritetemp Operation 8050, 5 pages, Jun. 26, 2002.
Ritetemp Operation 8085, pp. 1-6, prior to Apr. 21, 2005.
Saravanan et al, "Reconfigurable Wireless Interface for Networking Sensors," IJCSNS International Journal of Computer Science and Network Security, vol. 8 No. 7, pp. 270-276. Revised Jul. 20, 2008.
Screenshot of http://lagotek.com/index.html?currentSection=TouchIt, Lagotek, 1 page, prior to Mar. 29, 2012.
Sealed Unit Parts Co., Inc., Supco & CTC Thermostats . . . loaded with features, designed for value!, 6 pages, prior to Apr. 21, 2005.
Sharp Corporation, "GP1S036HEZ Phototransistor Output, Transmissive Photointerrupter with Tilt Direction (4-Direction) Detecting," pp. 1-11, Oct. 3, 2005.
Signetics Linear Products, "TDA1024 Zero Crossing Triac Trigger," Product Specification, 14 pages, Sep. 1985.
Totaline Model P474-1035 Owner's Manual Programmable 5-2 Day Digital Thermostat, pp. 1-21, Apr. 2003.
Totaline Star CPE230RF, Commercial Programmable Thermostat Wireless Transmitter, Owner's Manual, pp. 1-16, Oct. 1998.

(56) References Cited

OTHER PUBLICATIONS

Totaline Star P/N P474-0130 Non-Programmable Digital Thermostat Owner's Manual, pp. 1-22, prior to Apr. 21, 2005.
Totaline, "1 for All Programmable Digital Thermostat," Owner's Manual P/N P374-1100, 24 pages, Apr. 2001.
Totaline, "1 for All Programmable Digital Thermostat," Owner's Manual P/N P374-1100FM, 23 pages, Nov. 1998.
Totaline, "1 for All Programmable Digital Thermostat," Owner's Manual P/N P474-1050, 21 pages, Nov. 1998.
Totaline, "Intellistat Combination Temperature and Humidity Control," Owner's Manual P/N P374-1600, 25 pages, Jun. 2001.
Totaline, "P/N P374-0431 Thermostat Remote Control and Receiver," Owner's Manual, 11 pages, prior to Nov. 30, 2007.
Totaline, "P474-1100RF, P474-1100REC Wireless Thermostat," 1 page, prior to Nov. 30, 2007.
Totaline, "Programmable Thermostat Configurable for Advanced Heat Pump or Dual Fuel Operation," Owner's Manual P/N P374-1500, 24 pages, Jun. 1999.
Totaline, "Wireless Remote Sensor, Model P474-0401-1RF/REC," 2 pages, prior to Nov. 30, 2007.
Totaline, "Instructions P/N P474-1010", Manual, 2 pages, Dec. 1998.
Totaline, "Programmable Thermostat", Homeowner's Guide, 27 pages, Dec. 1998.
Totaline, "Wireless Programmable Digital Thermostat," Owner's Manual 474-1100RF, 22 pages, 2000.
Trane, "System Programming, Tracer Summit Version 14, BMTW-SVP01D-EN," 623 pages, 2002.
Trane, "Wireless Zone Sensor. Where Will Wireless Technology Take You?," 4 pages, Feb. 2006.
Travis Industries, Remote Fireplace Thermostat, Part #99300651, 6 pages, printed Feb. 3, 2003.
Trouble Shooting Guide for Ritetemp Thermostat 8082, 1 page, 2002.
Visor Handheld User Guide, 280 pages, Copyright 1999-2000.
Warmly Yours, "Model TH111GFCI-P (120 VAC)," Manual, pp. 1-4, prior to Jul. 7, 2004.
White-Rodgers 1F80-224 Programmable Electronic Digital Thermostat, Installation and Operation Instructions, 8 pages, prior to Apr. 21, 2005.
White-Rodgers Comfort-Set III Thermostat, pp. 1-44, prior to Jul. 7, 2004.
White-Rodgers Installation Instructions for Heating & Air Conditioning IF78 5/2 Day Programmable Thermostat, 7 pages, prior to Jul. 7, 2004.
White-Rodgers Installation Instructions for Heating & Air Conditioning IF78 Non-Programmable Thermostat, 6 pages, prior to Apr. 21, 2005.
White-Rodgers, "Installation Instructions for Heating & Air Conditioning IF72 5/2 Day Programmable Heat Pump Thermostat," 8 pages, prior to Jul. 7, 2004.
White-Rodgers, "Comfort-Set 90 Series Thermostat," Manual, pp. 1-24, prior to Jul. 7, 2004.
White-Rodgers, 1F80-240 "(for Heating Only systems) Programmable Electronic Digital Thermostat," Installation and Operation Instructions, 8 pages, prior to Jul. 7, 2004.
White-Rodgers, 1F80-241 "Programmable Electronic Digital Thermostat," Installation and Operation Instructions, 6 pages, prior to Jul. 7, 2004.
White-Rodgers, 1F80-261 "Programmable Electronic Digital Thermostat," Installation and Operation Instructions, 8 pages, prior to Jul. 7, 2004.
White-Rodgers, 1F81-261 "Programmable Electronic Digital Multi-Stage Thermostat," Installation and Operation Instructions, 8 pages, prior to Jul. 7, 2004.
White-Rodgers, 1F82-261 "Programmable Electronic Digital Heat Pump Thermostat," Installation and Operation Instructions, 8 pages, prior to Jul. 7, 2004.
White-Rodgers, Comfort-Set 90 Series Premium, 4 pages, prior to Apr. 21, 2005.
www.icmcontrols.com, Simplecomfort, SC3000 Single Stage Heat/Single Stage Cool or Single Stage Heat Pump/Manual Changeover, 1 page, prior to Jul. 7, 2004.
www.icmcontrols.com, Simplecomfort, SC3001 Single Stage Heat/Single Stage Cool or Single Stage Heat Pump/Manual Changeover, 1 page, prior to Jul. 7, 2004.
www.icmcontrols.com, Simplecomfort, SC3006 Single Stage Heat/Single Stage Cool or Single Stage Heat Pump/Manual Changeover, 1 page, prior to Jul. 7, 2004.
www.icmcontrols.com, Simplecomfort, SC3201 2 Stage Heat Pump Manual Changeover, 1 page, prior to Jul. 7, 2004.
www.icmcontrols.com, Simplecomfort, SC3801 2 Stage Heat/2 Stage Cool 2 Stage Heat Pump/Audio Changeover, 1 page, prior to Jul. 7, 2004.

\* cited by examiner

LOW POWER CONSUMPTION AC LOAD SWITCHES

BACKGROUND

The present disclosure pertains to control devices and particularly to devices consuming low amounts of power.

SUMMARY

The disclosure reveals a circuit that may ensure ultra-low power relay switching to control an AC load and avoid much of a reduction of a battery's lifetime. A control circuit may be designed to work where power is provided at very low duty cycles in that the on-time of applied voltage is quite short compared to its off-time. During the on-time, power such as that from a battery may be consumed to drive the circuit but overall such consumption of power is almost miniscule, for instance, a few microamperes or less from a three volt battery. An input FET may drive a pair of switching FETs that provide pulses to a transformer which provides a ramp of voltage that remains above zero volts to a pair of AC switch FETs. An output of the AC switch may go to operate relays of a wire saver for operating one or more thermostats.

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

Figure 1:
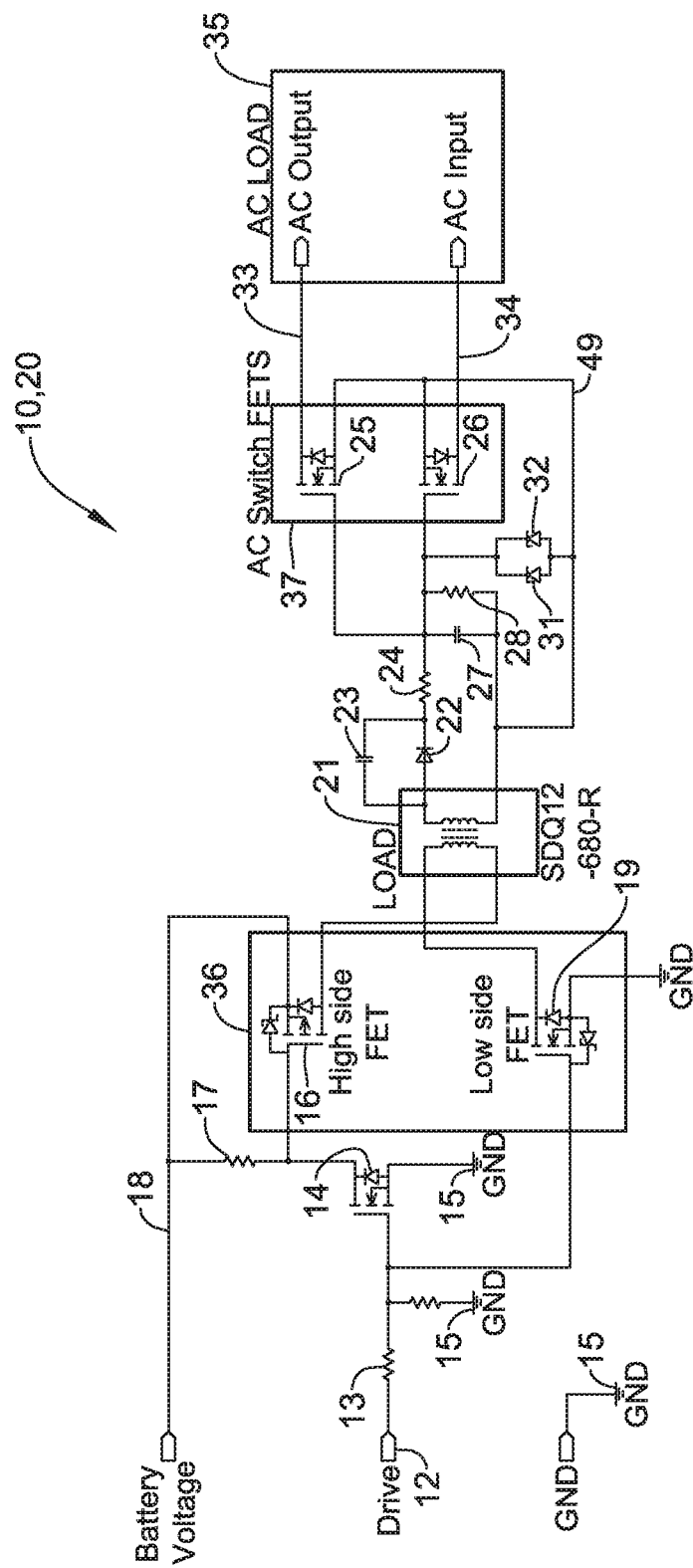
FIG. 1 is a diagram of an AC switch circuit having low power consumption.

FIG. 1 is a diagram of an AC switch circuit 10 having low power consumption. A second circuit 20 may also be utilized. A K circuit configuration 30 may use two circuits 10 and 20, as shown in a diagram of FIGS. 2 and 3. Circuit 20 is virtually the same as circuit 10. Circuit 10 may be regarded as a Y FET. Circuit 20 may be regarded as a G FET.

Circuit 10, 20 may disconnect unused parts from battery power while a load is turned on by a high side load FET 16 and a low side load FET 19. As a result, an AC load 35 may be normally on while battery power is cut, and the entire circuit may consume just a few microamperes.

Figure 5:
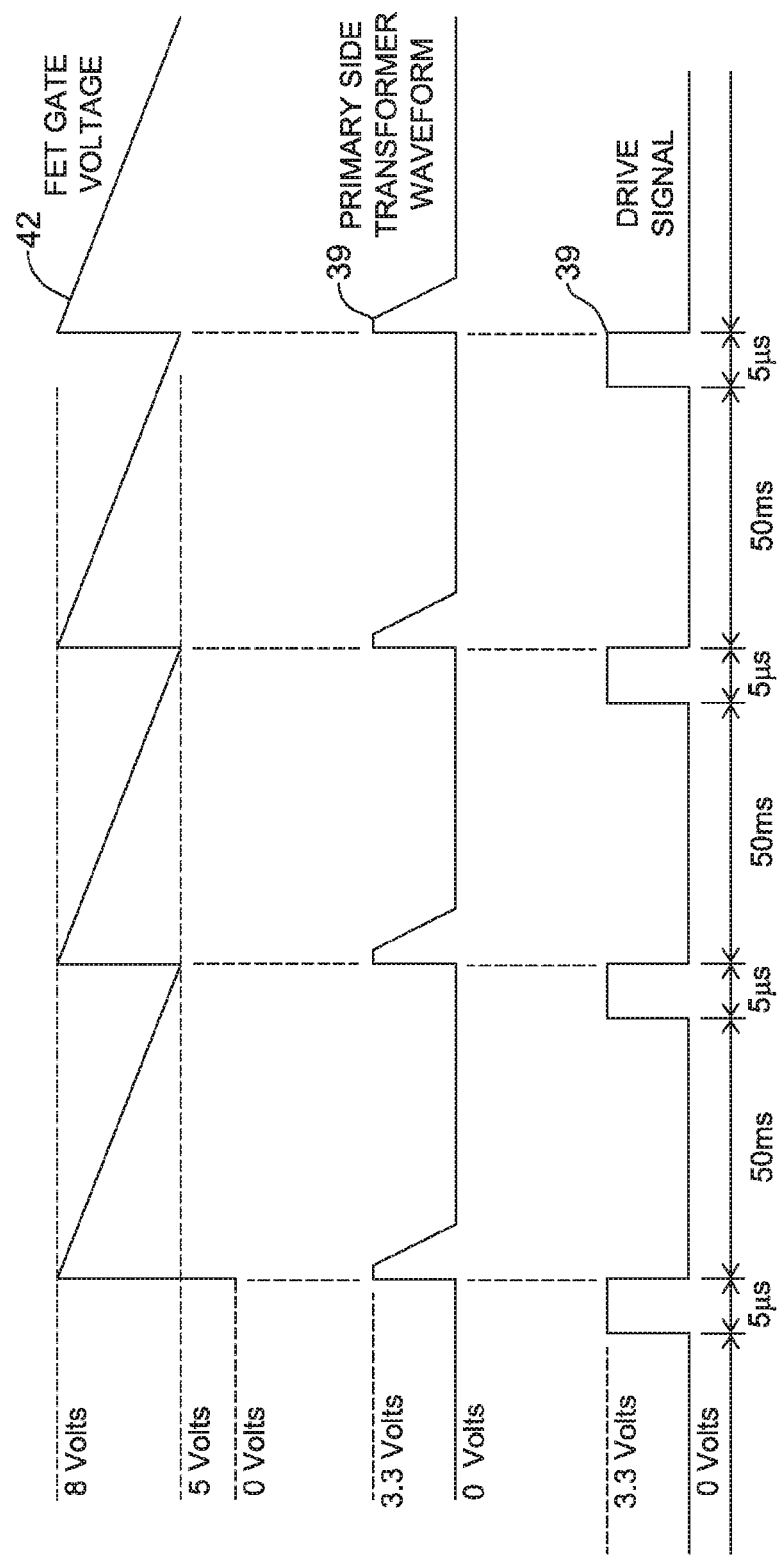
FIG. 5 is a diagram of several signals at certain points of the AC switch circuit.

Circuit 10, 20 may work at very low duty cycle, where the on-time is quite short compared to the off-time. During the on-time, battery power may be consumed but such consumption of power may be rather low since the duty cycle is low. During the off-time, a load 35 may be on but the battery power to the load can be cut-off by switch FETs 25 and 26 of package 37 (FDMC89521L), and the load may consume only leakage current, i.e., few microamperes. A supply voltage on conductor 18 for circuit 10 may operate in a range from 2.0 Vdc to 5.0 Vdc. FETs 16 and 19 of package 36 (FDC6321C) may be used as a load switch. A P-channel FET 16 may be placed in a high side of the load and an N-channel FET 19 may be placed in a low side of the load, respectively. FETs 16 and 19 may be controlled by an N-channel FET 14 (2N7002) and turned on and off simultaneously in less than 3.3 microseconds every 100 milliseconds by an input switching signal 38 (FIG. 5). The switching signal to the FET 14 and consequently to FETs 16 and 19 may be provided by a micro-processor or timer. Two N-channel FETs 25 and 26 (FDMC89521L) may be placed in package 37 as an AC switch for AC load 35.

Both positive and negative AC waveforms may pass through AC switch FETs (FDC89521L) while package 36 (FDC6321C) is turned off. A 68 micro-henry dual power inductor (SDQ12-680-R) or transformer 21 may be used as a load. Inductor 21 may isolate the battery power and AC load 35. Inductor 21 may work with a flyback switching topology. Total power consumption may be measured to be less than two microamperes while AC switch 37 (FDMC89521L) stays on.

A "K" circuit 30 that uses field effect transistors (FETs) 43 and 44 may be noted. A thermostat wire saver 41 (i.e., a Honeywell™ THP9045A wiring module with K circuitry) may be used with a thermostat that needs a 24 volt common wire but does not have one. The thermostat may work with a multiplexer which consists of two relays and two diodes mounted on the thermostat. But a relay may switch off so slowly that the K circuitry switches stay on for about two seconds. After this, the load may run continuously after another load runs. The present circuit may use MOSFETS (FETs) which can handle large voltage and current much faster than a relay. The circuit may insure that when the switch circuit is off, the load stops virtually instantly.

There may be a reliability increase with a MOSFET switching circuit used lieu of a relay circuit. The MOSFET circuit switching time appears to be much faster than that of a relay. When a FET is turned on, the load may run virtually instantly. When the FET is turned off, the load may stop virtually instantly.

Figure 2:
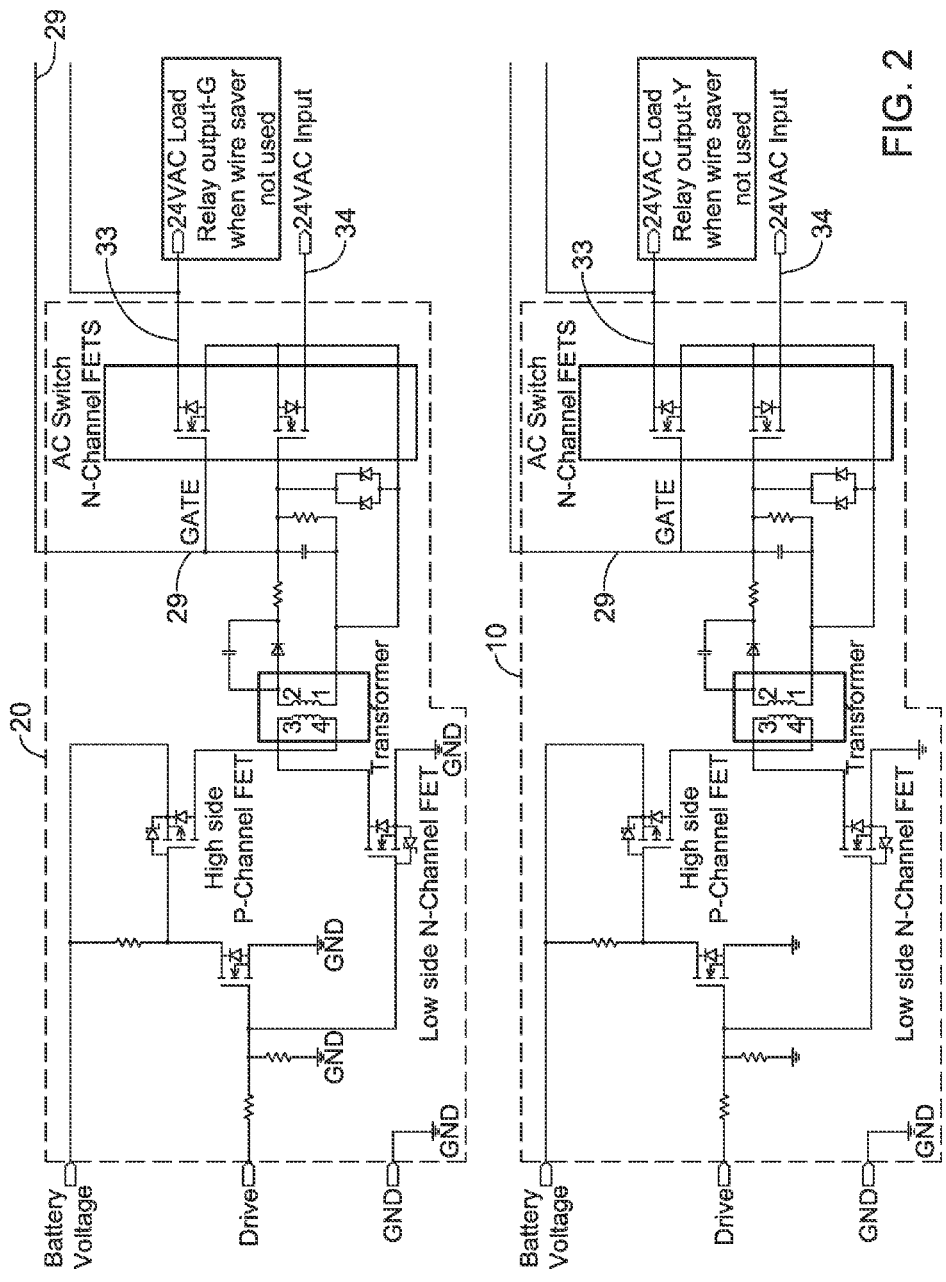
FIG. 2 is a diagram of two AC switches for parallel operation.
Figure 3:
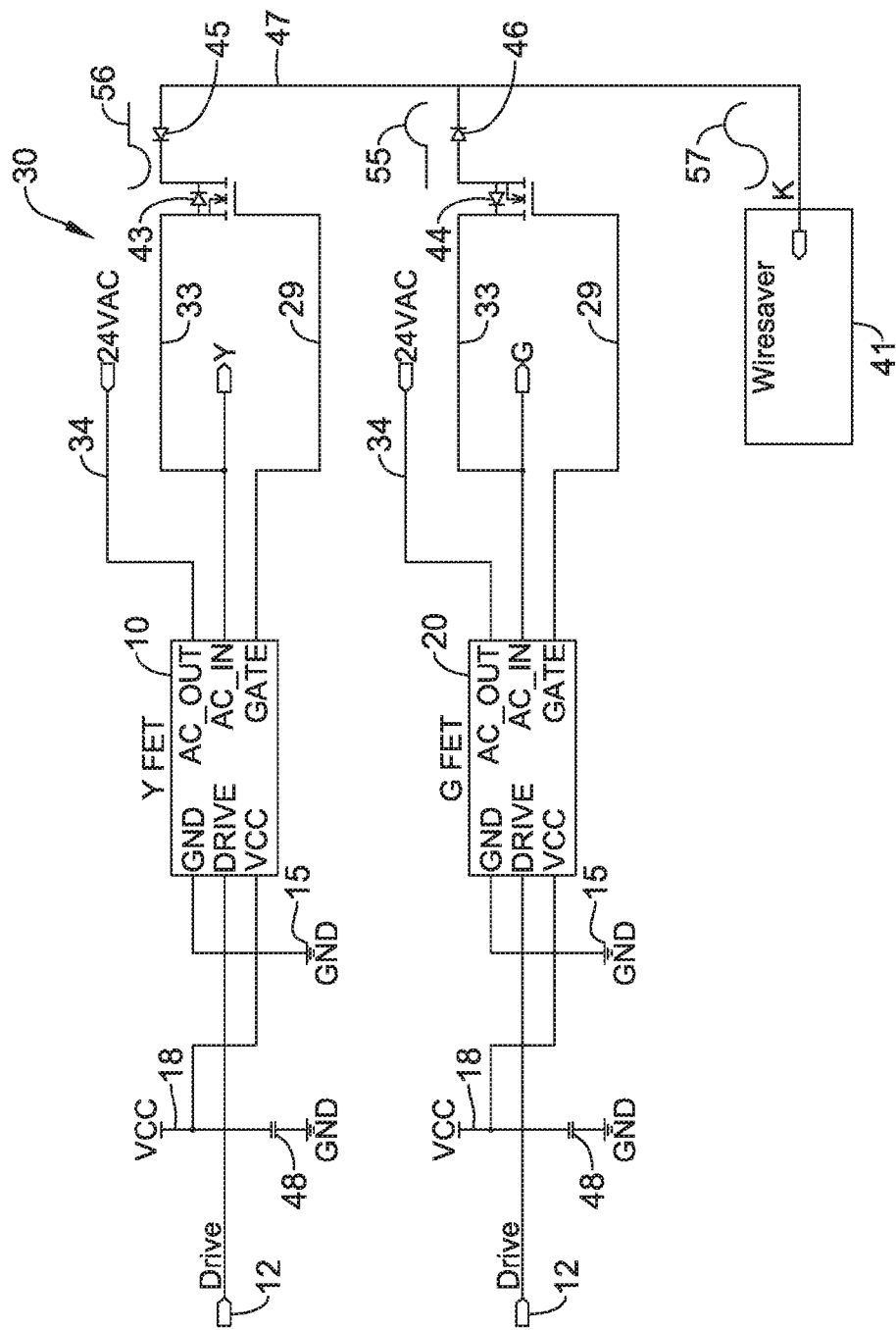
FIG. 3 is a diagram that shows a diagram of a circuit arrangement having two circuits for providing positive and negative portions of an AC waveform to a wire saver.
Figure 4:
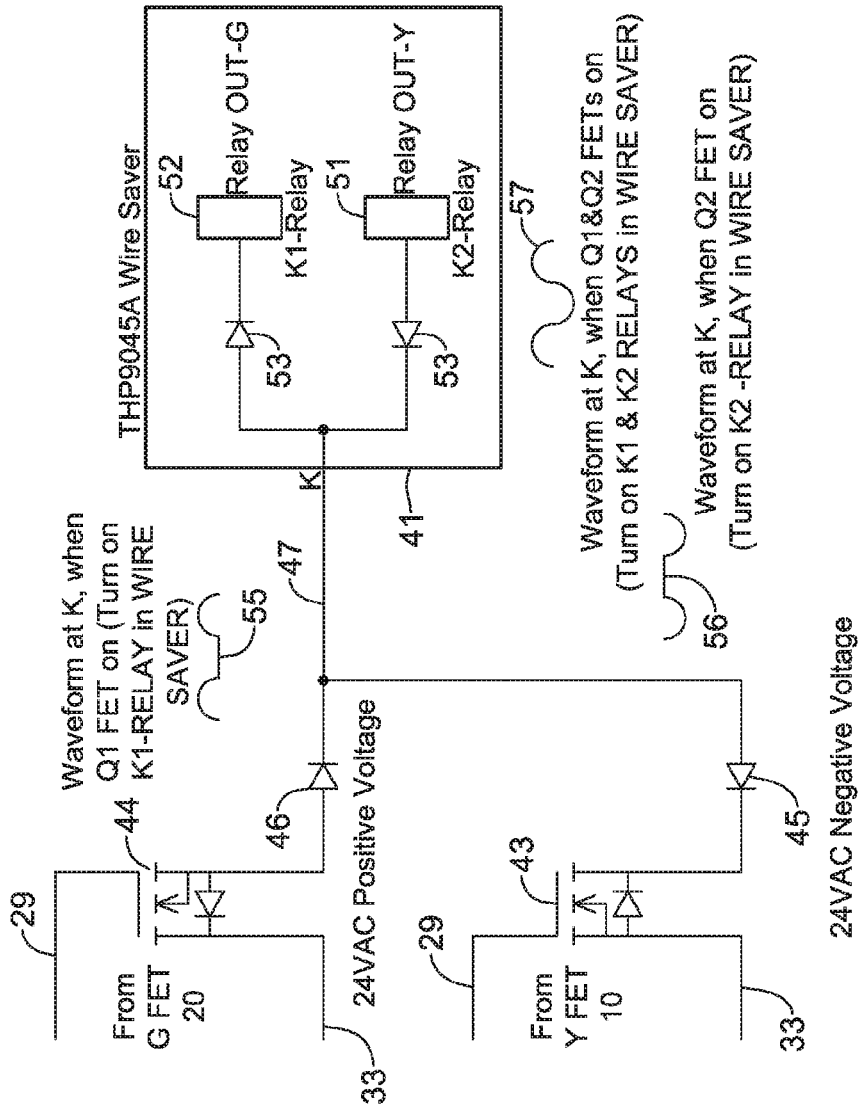
FIG. 4 is a diagram revealing some details of the wire saver.

FIG. 2 is a diagram that shows separate circuits 10 and 20. FIG. 3 is a diagram that shows a diagram of a circuit arrangement 30 incorporating circuits 10 and 20. FIG. 4 is a diagram that illustrates a connection of wire saver 41 relative to circuits 10 and 20. There may be one or more additional circuits that resemble circuits 10 and 20, as shown in FIGS. 1-4.

When a Y FET 10 is switched on, the following may occur. If an N-channel FET 43 (2N7002) is switched on, 24 VAC pulses may appear on the drain of FET 43. However, the positive 24 VAC pulses may be blocked by diode 45 and just the negative 24 VAC pulses appear on a K line 47 of wire saver 41. The pulses may enable a relay on the wire saver 41, such as a K2 relay 51 may be enabled in that the contacts close. In the meanwhile, a K1 relay 52 may be disabled because the 24 VAC negative pulses are being blocked by a body diode of FET 44. Also, the negative pulses may be blocked by diode 54. Relays 51 and 52 of wire saver or circuit 41 are shown in a diagram of FIG. 4.

When a G FET 20 is switched on, the following may occur. The N-channel FET 44 (2N7002) may be switched on and 24 VAC pulses may appear on the drain of FET 44. But the negative 24 VAC may be blocked by diode 46 and just the positive 24 VAC pulses may appear on K line 47 of wire saver 41. The positive pulses may enable a K1 relay 52 on the wire saver 41, and the G relay may be enabled in that the contacts close. In the meanwhile, the K2 relay 51 may be disabled because the 24 VAC positive pulses are being blocked by the body diode of FET 43. The positive pulses may also be blocked by diode 53.

When both Y FET 10 and G FET 20 are switched on, the following may occur. If FET 43 and FET 44 are switched on and 24 VAC pulses appear on the drains of FET 43 and FET 44, and both positive and negative 24 VAC pulses appear on K line 47 of wire saver 41, both K1 relay 52 and K2 relay 51 may be enabled in that both sets of contacts close. A K1 relay 52 may provide a G output. A K2 relay 51 may provide a Y output.

When both Y FET 10 and G FET 20 are switched off, the following may occur. When both Y and G FETs 10 and 20 are switched off, then both FET 43 and FET 44 may be switched off, and no 24 VAC pulses will appear on K line 47 of wire saver 41. Both K1 relay 52 and K2 relay 51 may be disabled in that both sets of contacts are open.

When just FET 44 is on, then a waveform 55 may appear on line 47 and turn on relay 52 in wire saver 41. When just FET 43 is on, then a waveform 56 may appear on line 47 and turn on relay 51. When FET 44 and FET 43 are on, then a waveform 57 may appear on line 47 and turn on relay 52 and relay 51. Waveforms 55, 56 and 57 are shown in FIG. 4.

When wire saver 41 is not in use, there may be a 24 VAC load relay 51 output Y relative to circuit 10. When wire saver 41 is not in use, there may be a 24 VAC load relay 52 output G relative to circuit 20.

Examples for relay out connections may be noted. As to "Relay out-G" from component 52 in FIG. 4, a blower relay in a furnace may be connected to G. Activating the blower relay may turn a blower on when 24 VAC appears at the relay out-G terminal. As to "Relay out-Y" from component 51, a compressor/condenser fan relay in a furnace may be connected to Y. Activating a compressor relay may turn a compressor on when 24 VAC appears at the relay out-Y terminal.

To reiterate, FIG. 1 is a diagram of circuit 10, 20. The present system may have two of these circuits which may be noted as 10 and 20 for Y and G channels, respectively, and referred to as Y FET and G FET, respectively, in FIG. 3. An input signal may go to a terminal 12. An example of the input signal may be a signal 38 as shown in FIG. 5. Signal 38 may be a low duty cycle square wave signal having a 3.3 volt magnitude for a time width of 5 microseconds and a zero volt magnitude for 50 milliseconds per cycle period. A ground or reference 15 may be at zero volts.

Signal 38 may proceed from terminal 12 through a 10 ohm resistor 13 and on to a gate of an N-channel FET 14. A 100 k ohm resistor 15 may be connected between the gate of FET 14 and a ground 15. The source of FET 14 may be connected to ground 15. The drain of FET 14 may be connected a gate of a high side P-channel FET 16 and to a one end of a 2.26 k ohm resistor 17. The other end of resistor 17 may be connected to conductor 18 for connection to a positive terminal of a battery. A negative terminal of the battery may be connected to ground 15. There may be a 0.1 microfarad capacitor 48 connected from conductor 18 to ground 15 (FIG. 3). The positive terminal of battery may be connected to a source of FET 16. The gate of FET 14 may be connected to a gate of a low side N-channel FET 19. A source of FET 19 may be connected to ground 15.

A drain of FET 16 may be connected to a dot-end of a first winding (i.e., primary side) of a transformer 21. A drain of FET 19 may be connected to a non-dot end of the first winding of transformer 21. A signal 39 shown in FIG. 5 may appear across the first winding of transformer 21. Signal 39 may begin at zero volts go to 3.3 volts when signal 38 goes from 3.3 volts to zero volts almost instantly. Signal 39 may stay at 3.3 volts for a short duration and then decline to zero volts over a period of time much before the next cycle begins.

A non-dot end of a second winding (i.e., secondary side) of transformer 21 may be connected to an anode of a diode 22. A 100 picofarad capacitor 23 may be connected across the terminals of diode 22. A cathode of diode 22 may be connected to one end of a 15 ohm resistor 24. The other end of resistor 24 may be connected to a gate of an N-channel FET 25 and a gate of an N-channel FET 26 via a gate conductor 29. A signal 42 shown in FIG. 5 may appear on gate conductor 29. Signal 42 may begin at zero volts and then rise almost instantly to 8 volts at the beginning of the first rise of signal 39 to 3.3 volts. When signal 42 reaches 8 volts it may gradually decline down to 5 volts and then rise almost instantly to 8 volts when signal 39 again goes up to 3.3 volts. The pattern of signals 38, 39 and 42 may continue until drive signal 38 is removed from terminal 12.

A dot-end of the second winding of transformer 21 may be connected to sources of FET 25 and FET 26 along conductive line 49. A 0.01 microfarad capacitor 27 may have one end connected to the gates of FETs 25 and 26 and the other end connected to the dot-end of the second winding of transformer 21. A 10 mega ohm resistor 28 may have one end connected to the gates of FETs 25 and 26 and the other end connected to the dot-end of the second winding of transformer 21. Two zener diodes 31 and 32 may have their cathodes connected to the gates of FETs 25 and 26 and their anodes connected to the dot-end of the second winding of transformer 21. The windings of transformer 21 may have a one-to-one turn's ratio. A drain of FET 25 may be connected as an AC output 33 of AC load 35. A drain of FET 26 may be connected to an AC input 34 of AC load 35.

FET 14 may be a 2N7002 N-Channel enhancement mode device. FETs 16 and 19 may be in a package 36 of dual N and P channel logic level enhancement mode FETs having a model no. FDC6321C. FETs 25 and 26 may be in a package 37 of a dual N-channel MOSFET having a model no. FDMC89521L. The noted FET products may be those of Fairchild Semiconductor Corporation. Transformer 21 may have a model no. SDQ12-680-R that is a Coiltronics™ product. Diode 22 may have a model no. 1N914BWS that is a product of Fairchild Semiconductor Corporation.

To recap, a mechanism for low power consumption load switches, may incorporate a switch having an input terminal for a low duty cycle signal having a duty cycle of less than ten percent, and having an output terminal for connection to a voltage supply, a dual switch having a first input terminal connected to the output terminal of the single switch, a second input terminal connected to the input terminal of the single switch, and having first and second output terminals, respectively, a transformer having a first end of a primary winding connected to the second output terminal of the dual switch, a second end of the primary winding connected to the first output terminal of the dual switch, and having a first end and a second end of a secondary winding, and an AC switch having a first terminal connected to the first end of the secondary winding of the transformer, a second terminal connected to the second end of the secondary winding of the transformer, and having third and fourth terminals. The third and fourth terminals of the AC switch may be for connection to a load.

The low duty cycle signal may incorporate a series of pulses.

A signal appearing across the first and second ends of the primary winding of the transformer, may start at a trailing edge of each pulse of the low duty cycle signal, with an initial maximum magnitude and, within a period of time less than a width of a pulse of the low duty cycle signal, may ramp down to zero.

A signal appearing at the first terminal of the AC switch may start at a leading edge of the signal appearing across the first and second ends of the primary winding of the transformer, then rise to a first voltage and then ramp down to a second voltage, where the signal at a next leading edge of the signal appearing across the first and second ends of the primary winding of the transformer, may then rise to the first voltage and then ramp down to the second voltage at a next leading edge of a next signal appearing across the first and second ends of the primary winding of the transformer, in a repetitive manner as long as the low duty cycle signal appears at the input of the signal switch and the voltage supply is provided at the output terminal of the single switch.

An amount of current from the voltage supply may range from one-tenth microampere to one milliampere for a control current at the load greater than ten milliamperes.

An approach for low power switching of a load, may incorporate providing an input FET for receiving a low duty cycle signal having a duty cycle of less than ten percent and for connection to a supply voltage, to be switched in accordance with the low duty cycle signal, connecting an input of a high side FET to an output of the input FET, connecting an input of a low side FET to a terminal for receiving the low duty cycle signal, connecting a first end of a primary winding of a transformer to an output of the low side FET, connecting a second end of the primary winding of the transformer to an output of the high side FET, connecting a first end of a secondary winding of the transformer to an input of a first AC switch FET and an input of a second AC switch FET, connecting a second end of the secondary winding of the transformer to a first terminal of the first AC switch FET and a first terminal of the second AC switch FET, and connecting a second terminal of the first AC switch FET and a second terminal of the second AC switch FET to an AC load.

The input FET may incorporate a gate for receiving the low duty cycle signal. The input FET may incorporate a drain for connection to the supply voltage and as an output of the input FET. The high side FET may incorporate a gate as the input connected to the output of the input FET. The low side FET may incorporate a gate as the input connected to the terminal for receiving the low duty cycle signal. The low side FET may incorporate a drain as the output of the low side FET. The high side FET may incorporate a drain as the output of the high side FET. The first AC switch FET may incorporate a gate as the input of the first AC switch FET. The second AC switch FET may incorporate a gate as the input of the second AC switch FET. The first AC switch FET may incorporate a source as the first terminal of the first AC switch FET. The second AC switch FET may incorporate a source as the first terminal of the second AC switch FET. The first AC switch FET may incorporate a drain as the second terminal of the first AC switch FET. The second AC switch FET may incorporate a drain as the second terminal of the second AC switch FET.

The input FET may be an N-channel device. The high side FET may be a P-channel device. The low side FET may be an N-channel device. The first AC switch FET may be an N-channel device. The second AC switch FET may be an N-channel device.

The low duty cycle signal, incorporating pulses, may have a duty cycle less than five percent. A signal appearing across the first and second ends of the primary winding of the transformer, may begin at a trailing edge of each pulse of the low duty cycle signal, with an initial maximum magnitude and after a period of time less than a period of time of a width of pulse of the low duty cycle signal, ramp with a decline to a minimum magnitude.

A signal appearing on an input of the first AC switch FET may start at a leading edge of the signal appearing across the first and second ends of the primary winding of the transformer, rise to first voltage and then decline to a second voltage, where a next leading edge of a signal appearing across the first and second ends of the primary winding may rise to the first voltage and then decline to the second voltage at a next signal appearing across the first and second ends of the primary winding, in a repetitive manner as long as the low duty cycle signal is being received by the input FET, and connection to the supply voltage is provided at the input FET.

An amount of current from the supply voltage may range from one-tenth microampere to one milliampere for a control current of ten milliamperes or greater at the AC load.

A load switch system may incorporate an input interface, a signal conditioner and driver connected to the input interface, an inductive load connected to the signal conditioner and driver, and an AC switch connected to the inductive load. A signal to the input interface may have a duty cycle less than ten percent.

The input interface may incorporate a transistor having an input for receiving the signal. The signal conditioner and driver may incorporate a dual channel circuit. The inductive load may incorporate a transformer. The AC switch may incorporate a dual transistor AC switch.

The dual channel circuit may have a first input connected to an output of the transistor, and a second input connected to the input of the transistor. The transformer may have a first end of a primary winding connected to a first output of the dual channel circuit and a second end of the primary winding connected to a second output of the dual channel circuit. The dual transistor AC switch may have a first common terminal connected to a first end of a secondary winding of the transformer, a second common terminal connected to a second end of the secondary winding of the transformer, and a first output and second output connected to an AC load.

The input of the transistor may be for the signal having a duty cycle. The output of the transistor and the first input of the dual channel circuit may be for connection via a resistor to a battery voltage. A first common terminal of the dual channel circuit may be for connection to a battery voltage. A common terminal of the transistor and a second common terminal of the dual channel circuit may be for connection to a ground having a zero voltage reference.

The duty cycle may be less than one-tenth percent.

The transistor may be an N-channel FET. The dual channel circuit may incorporate a P-channel FET and an N-channel FET. The dual transistor AC switch may incorporate a first N-channel FET and a second N-channel FET.

The input of the transistor may incorporate a gate of a FET. The output of the transistor may incorporate a drain of the FET. The first input of the dual channel circuit may incorporate a gate of a first FET. The first common terminal of the dual channel circuit may incorporate a source of the first FET. The common terminal of the transistor may incorporate a source of the FET. The second common terminal of the dual channel circuit may incorporate a source of a second FET. The first output of the dual channel circuit may incorporate a drain of the first FET. The second output of the dual channel circuit may incorporate a drain of the second FET.

A load switch system may further incorporate a diode connected in series between the second common terminal of the dual transistor AC switch and the second end of the secondary winding of the transformer.

The second common terminal of the dual transistor AC switch may incorporate first and second gates of a first FET and a second FET, respectively, of the dual transistor AC switch. The first common terminal of the dual transistor AC switch may incorporate a first source and second source of the first FET and the second FET, respectively, of the dual transistor AC switch. The first output and the second output connected to the AC load may incorporate a first drain and second drain of the first FET and the second FET, respectively, of the dual transistor AC switch.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A mechanism for low power consumption load switches, comprising:
    a single switch having an input terminal for a low duty cycle signal having a duty cycle of less than ten percent, and having an output terminal for connection to a voltage supply;
    a dual switch having a first input terminal connected to the output terminal of the single switch, a second input terminal connected to the input terminal of the single switch, and having first and second output terminals, respectively;
    a transformer having a first end of a primary winding connected to the second output terminal of the dual switch, a second end of the primary winding connected to the first output terminal of the dual switch, and having a first end and a second end of a secondary winding;
    an AC switch having a first terminal connected to the first end of the secondary winding of the transformer, a second terminal connected to the second end of the secondary winding of the transformer, and having third and fourth terminals; and
    wherein the third and fourth terminals of the AC switch are for connection to a load.

2. The mechanism of claim 1, wherein the low duty cycle signal comprises a series of pulses.

3. The mechanism of claim 1, wherein a signal appearing across the first and second ends of the primary winding of the transformer, starts at a trailing edge of each pulse of the low duty cycle signal, with an initial maximum magnitude and, within a period of time less than a width of a pulse of the low duty cycle signal, ramps down to zero.

4. The mechanism of claim 1, wherein a signal appearing at the first terminal of the AC switch starts at a leading edge of the signal appearing across the first and second ends of the primary winding of the transformer, then rises to a first voltage and then ramps down to a second voltage, where the signal at a next leading edge of the signal appearing across the first and second ends of the primary winding of the transformer, then rises to the first voltage and then ramps down to the second voltage at a next leading edge of a next signal appearing across the first and second ends of the primary winding of the transformer, in a repetitive manner as long as the low duty cycle signal appears at the input of the single switch and the voltage supply is provided at the output terminal of the single switch.

5. The mechanism of claim 1, wherein an amount of current from the voltage supply ranges from one-tenth microampere to one milliampere for a control current at the load greater than ten milliamperes.

6. A method for low power switching of a load, comprising:
    providing an input FET for receiving a low duty cycle signal having a duty cycle of less than ten percent and for connection to a supply voltage, to be switched in accordance with the low duty cycle signal;
    connecting an input of a high side FET to an output of the input FET;
    connecting an input of a low side FET to a terminal for receiving the low duty cycle signal;
    connecting a first end of a primary winding of a transformer to an output of the low side FET;
    connecting a second end of the primary winding of the transformer to an output of the high side FET;
    connecting a first end of a secondary winding of the transformer to an input of a first AC switch FET and an input of a second AC switch FET;
    connecting a second end of the secondary winding of the transformer to a first terminal of the first AC switch FET and a first terminal of the second AC switch FET; and
    connecting a second terminal of the first AC switch FET and a second terminal of the second AC switch FET to an AC load; and
    wherein a signal appearing on an input of the first AC switch FET starts at a leading edge of the signal appearing across the first and second ends of the primary winding of the transformer, rises to a first voltage and then declines to a second voltage, where a next leading edge of a signal appearing across the first and second ends of the primary winding rises to the first voltage and then declines to the second voltage at a next signal appearing across the first and second ends of the primary winding, in a repetitive manner as long as the low duty cycle signal is being received by the input FET, and connection to the supply voltage is present at the input FET.

7. The method of claim 6, wherein:
    the input FET is an N-channel device;
    the high side FET is a P-channel device;
    the low side FET is an N-channel device;
    the first AC switch FET is an N-channel device; and
    the second AC switch FET is an N-channel device.

8. The method of claim 6, wherein:
    the low duty cycle signal, comprising pulses, has a duty cycle less than five percent; and
    a signal appearing across the first and second ends of the primary winding of the transformer, begins at a trailing edge of each pulse of the low duty cycle signal, with an initial maximum magnitude and after a period of time less than a period of time of a width of pulse of the low duty cycle signal, ramps with a decline to a minimum magnitude.

9. The method of claim 6, wherein an amount of current from the supply voltage ranges from one-tenth microampere to one milliampere for a control current of ten milliamperes or greater at the AC load.

10. A load switch system comprising:
an input interface;
a signal conditioner and driver connected to the input interface;
an inductive load connected to the signal conditioner and driver; and
an AC switch connected to the inductive load; and
wherein:
 a signal to the input interface has a duty cycle less than ten percent
 the input interface comprises a transistor having an input for receiving the signal;
 the signal conditioner and driver comprise a dual channel circuit;
 the inductive load comprises a transformer;
 the AC switch comprises a dual transistor AC switch;
 the dual channel circuit has a first input connected to an output of the transistor, and a second input connected to the input of the transistor;
 the transformer has a first end of a primary winding connected to a first output of the dual channel circuit and a second end of the primary winding connected to a second output of the dual channel circuit; and
 the dual transistor AC switch has a first common terminal connected to a first end of a secondary winding of the transformer, a second common terminal connected to a second end of the secondary winding of the transformer, and a first output and second output connected to an AC load.

11. The system of claim 10, wherein:
the input of the transistor is for the signal having a duty cycle;
the output of the transistor and the first input of the dual channel circuit are for connection via a resistor to a battery voltage;
a first common terminal of the dual channel circuit is for connection to a battery voltage; and
a common terminal of the transistor and a second common terminal of the dual channel circuit are for connection to a ground having a zero voltage reference.

12. The system of claim 10, wherein the duty cycle is less than one-tenth percent.

13. The system of claim 10, wherein:
the transistor comprises an N-channel FET;
the dual channel circuit comprises a P-channel FET and an N-channel FET; and
the dual transistor AC switch comprises a first N-channel FET and a second N-channel FET.

14. The system of claim 11, wherein:
the input of the transistor comprises a gate of a FET;
the output of the transistor comprises a drain of the FET;
the first input of the dual channel circuit comprises a gate of a first FET;
the first common terminal of the dual channel circuit comprises a source of the first FET;
the common terminal of the transistor comprises a source of the FET;
the second common terminal of the dual channel circuit comprises a source of a second FET;
the first output of the dual channel circuit comprises a drain of the first FET; and
the second output of the dual channel circuit comprises a drain of the second FET.

15. The system of claim 10, further comprising a diode connected in series between the second common terminal of the dual transistor AC switch and the second end of the secondary winding of the transformer.

16. The system of claim 10, wherein:
the second common terminal of the dual transistor AC switch comprises first and second gates of a first FET and a second FET, respectively, of the dual transistor AC switch; and
the first common terminal of the dual transistor AC switch comprises a first source and second source of the first FET and the second FET, respectively, of the dual transistor AC switch; and
the first output and the second output connected to the AC load comprise a first drain and second drain of the first FET and the second FET, respectively, of the dual transistor AC switch.

* * * * *